(12) United States Patent
Sugaya et al.

(10) Patent No.: US 7,235,995 B2
(45) Date of Patent: Jun. 26, 2007

(54) TEST APPARATUS AND TESTING METHOD

(75) Inventors: Tomoyuki Sugaya, Tokyo (JP); Hiroyasu Nakayama, Tokyo (JP)

(73) Assignee: Advantest Corporation, Tokyo (JP)

( * ) Notice: Subject to any disclaimer, the term of this patent is extended or adjusted under 35 U.S.C. 154(b) by 64 days.

(21) Appl. No.: 11/180,896

(22) Filed: Jul. 13, 2005

(65) Prior Publication Data
US 2006/0052964 A1    Mar. 9, 2006

Related U.S. Application Data

(63) Continuation of application No. PCT/JP2005/012836, filed on Jul. 12, 2005.

(30) Foreign Application Priority Data
Aug. 23, 2004   (JP)  ............................ 2004-242996

(51) Int. Cl.
     *G01R 31/26*     (2006.01)
(52) U.S. Cl. ...................... 324/765; 714/736
(58) Field of Classification Search ............ None
See application file for complete search history.

(56) References Cited

U.S. PATENT DOCUMENTS

| | | | |
|---|---|---|---|
| 6,198,273 B1* | 3/2001 | Onishi et al. ............. | 324/158.1 |
| 6,653,855 B2* | 11/2003 | Mori et al. ................ | 324/763 |
| 6,727,723 B2* | 4/2004 | Shimizu et al. ............. | 324/765 |
| 6,784,686 B2* | 8/2004 | Nishida et al. ............. | 324/765 |
| 6,966,019 B2* | 11/2005 | Viens et al. ................ | 714/724 |
| 6,975,956 B2* | 12/2005 | Chang et al. ............... | 702/120 |

FOREIGN PATENT DOCUMENTS

JP      2002-174661     *   6/2002  .................... 31/28

OTHER PUBLICATIONS

International Search Report issued for PCT application No. PCT/JP2005/012826 mailed on Oct. 25, 2005, 2 pages.

* cited by examiner

*Primary Examiner*—Ha Tran Nguyen
*Assistant Examiner*—Richard Isla-Rodas
(74) *Attorney, Agent, or Firm*—Osha Liang LLP

(57) ABSTRACT

A test apparatus that tests a device under test, including a main memory having an expectation pattern storing region storing an expectation pattern sequence to be sequentially compared with output patterns sequentially output from a terminal of the device; a test pattern outputting unit for sequentially inputting a plurality of test patterns into the device; a capture unit for sequentially acquiring the output patterns into an output pattern storing region on the main memory; a memory reading unit for reading an output pattern sequence consisting of the plurality of acquired output patterns and the expectation pattern sequence from the main memory when the acquisition process acquiring the output patterns into the output pattern storing region has been terminated; and an expectation comparing unit for comparing the read expectation pattern sequence and the output pattern sequence.

5 Claims, 4 Drawing Sheets

TEST APPARATUS AND TESTING METHOD

CROSS REFERENCE TO THE RELATED APPLICATION

The present application is a continuation application of PCT/JP2005/012836 filed on Jul. 12, 2005, which claims priority from a Japanese Patent application No. 2004-242996 filed on Aug. 23, 2004, the entire contents of which are incorporated herein by reference for all purposes.

BACKGROUND OF THE INVENTION

1. Field of the Invention

The present invention relates to a test apparatus and a testing method reducing a required bandwidth for a memory provided in a test apparatus.

2. Description of Related Art

A test apparatus is designed to test a device under test (DUT) based on a test program. Specifically, the test apparatus sequentially reads and executes commands of the test program from a memory. Then, the test apparatus reads a test pattern corresponding to each command from the memory to output the pattern to each terminal of the device under test. As a result, an output pattern output from the device under test is compared with a predetermined expectation pattern, which is a pattern to be output from the device under test.

Here, since a related patent document is not known, a description of which is omitted.

As described above, the test apparatus reads each command of the test program, the test pattern, and the expectation pattern from the memory during really operating the test program. Then, it is desirable that these data are stored on one common main memory, in order to utilize memory capacity of the memory effectively. In this case, the main memory must realize a bandwidth capable of reading the command, the test pattern, and the expectation pattern during really operating the device under test.

On the other hand, when the failure of the device under test is detected according to the result of the test, a user may want to analyze the output pattern in order to investigate the cause. In order to realize this, it is desirable to store the output pattern on the main memory. However, in order to read the command, the test pattern, and the expectation pattern and also write the output pattern in the main memory, it is necessary to further raise the bandwidth of the main memory, thereby increasing the cost of the test apparatus.

SUMMARY OF THE INVENTION

Therefore, it is an object of the present invention to provide a test apparatus that can solve the foregoing problems. The above and other objects can be achieved by combinations described in the independent claims. The dependent claims define further advantageous and exemplary combinations of the present invention.

To solve this object, according to the first aspect of the present invention, there is provided a test apparatus that tests a device under test. The test apparatus includes: a main memory having an expectation pattern storing region storing an expectation pattern sequence to be sequentially compared with a plurality of output patterns sequentially output from a terminal of the device under test; a test pattern outputting unit operable to sequentially input a plurality of test patterns into the device under test and sequentially output the output patterns from the device under test; a capture unit operable to sequentially acquire the output patterns into an output pattern storing region on the main memory; a memory reading unit operable to read an output pattern sequence consisting of the plurality of acquired output patterns and the expectation pattern sequence from the main memory when the acquisition process acquiring the output patterns into the output pattern storing region has been terminated; and an expectation comparing unit operable to compare the read expectation pattern sequence and the output pattern sequence.

Moreover, the expectation comparing unit may sequentially compare each of a plurality of expectation patterns included in the expectation pattern sequence and each of the plurality of output patterns included in the output pattern sequence every cycle, the test apparatus may further include a cycle period switching unit operable to compare a cycle period of a cycle, in which the expectation comparing unit repeatedly compares each expectation pattern and each corresponding output pattern, and a cycle, in which the test pattern outputting unit outputs each output pattern from the device under test, in order to largely set the cycle period of the cycle, the memory reading unit may read the output pattern sequence consisting of the plurality of output patterns stored on the main memory and the expectation pattern sequence from the main memory in the cycle period set by the cycle period switching unit, and the expectation comparing unit may compare the expectation pattern sequence and the output pattern sequence by the number of cycles identical with the number of cycles by which the output pattern sequence is output from the device under test.

Moreover, the test apparatus may further include a mode switching unit operable to select a first mode sequentially acquiring the output patterns into the main memory during outputting the output patterns from the device under test or a second mode sequentially reading the expectation patterns corresponding to the output patterns from the main memory during outputting the output patterns from the device under test, when the first mode has been selected, the capture unit may sequentially acquire the output patterns output from the device under test into the main memory, the memory reading unit may read the output pattern sequence consisting of the plurality of output patterns stored on the main memory and the expectation pattern sequence from the main memory when the acquisition process has been terminated, and the expectation comparing unit may compare the read expectation pattern sequence and the output pattern sequence, and when the second mode has been selected, the capture unit may not store the output patterns output from the device under test on the main memory, the memory reading unit may sequentially read the expectation pattern sequence from the expectation pattern storing region, and the expectation comparing unit may sequentially compare the plurality of expectation patterns included in the expectation pattern sequence read by the memory reading unit with the plurality of output patterns.

Moreover, the test apparatus may further include: a command memory operable to store a test program for the device under test; and a command executing unit operable to sequentially execute a plurality of commands included in the test program every command cycle, the command executing unit may sequentially re-execute the plurality of commands included in the test program when the acquisition process has been terminated, the memory reading unit may read the expectation patterns and the output patterns corresponding to each of the plurality of re-executed commands from the main memory, and the expectation comparing unit may compare the expectation pattern sequence and the output pattern sequence by comparing the expectation patterns and the output patterns corresponding to each of the plurality of re-executed commands.

According to the second aspect of the present invention, there is provided a testing method testing a device under test by means of a test apparatus. The test apparatus includes a main memory that has an expectation pattern storing region storing an expectation pattern sequence to be sequentially compared with a plurality of output patterns sequentially output from a terminal of the device under test, and the testing method includes: a test pattern outputting step of sequentially inputting a plurality of test patterns into the device under test and sequentially outputting the output patterns from the device under test; a capture step of sequentially acquiring the output patterns into an output pattern storing region on the main memory; a memory reading step of reading an output pattern sequence consisting of the plurality of acquired output patterns and the expectation pattern sequence from the main memory when the acquisition process acquiring the output patterns into the output pattern storing region has been terminated; and an expectation comparing step of comparing the read expectation pattern sequence and the output pattern sequence.

The summary of the invention does not necessarily describe all necessary features of the present invention. The present invention may also be a sub-combination of the features described above.

According to the present invention, it is possible to store an output pattern from a device under test on a main memory without increasing a request bandwidth of the main memory of a test apparatus.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
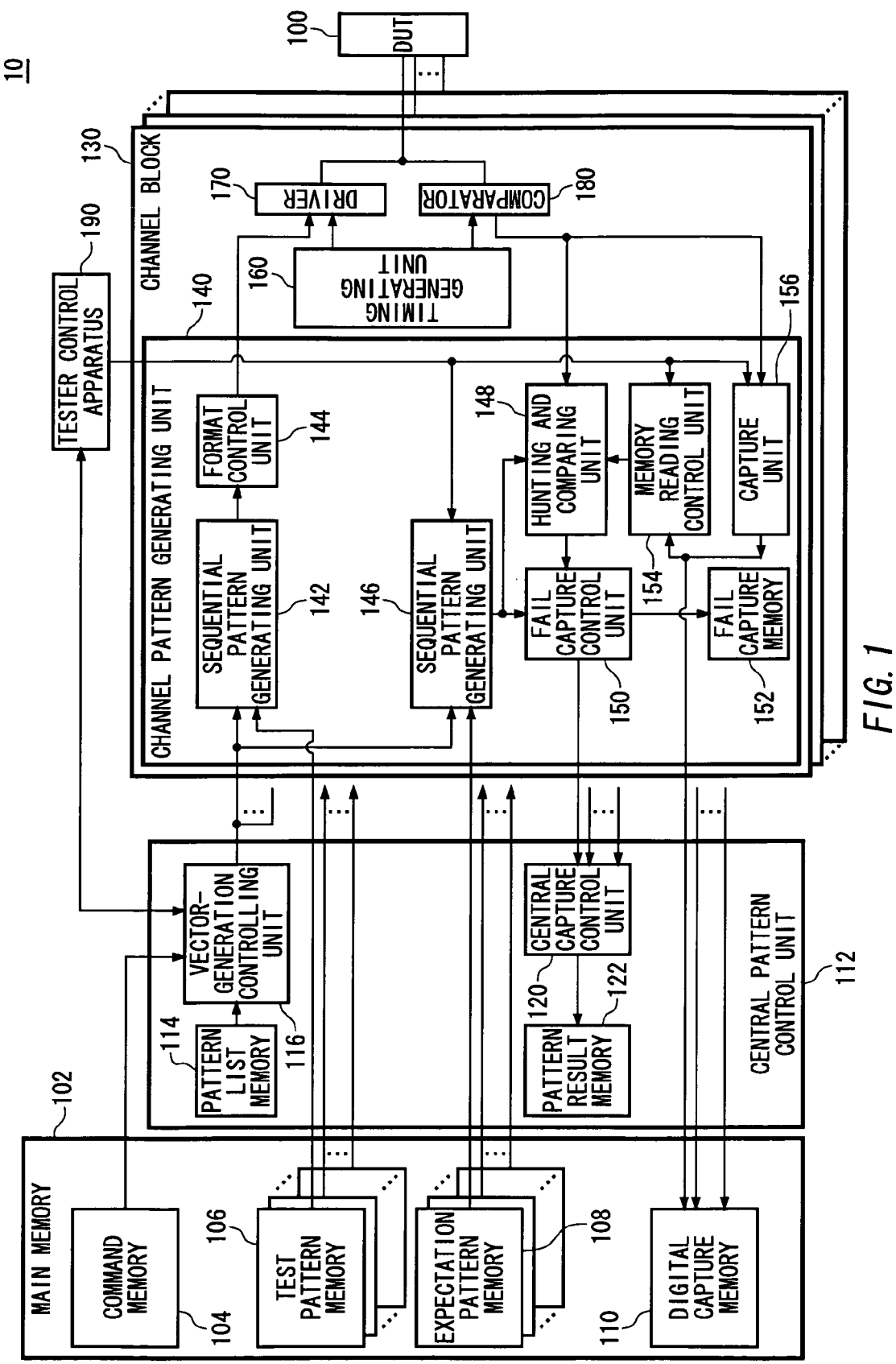
FIG. 1 shows a configuration of a test apparatus according to an embodiment of the present invention.

FIG. 1 shows a configuration of a test apparatus 10 according to an embodiment of the present invention. The test apparatus 10 tests a DUT 100 including one or a plurality of terminals, and includes a main memory 102, a central pattern control unit 112, and a plurality of channel blocks 130.

The main memory 102 stores a test program for the DUT 100, and records an output pattern output from the DUT 100, which is obtained by executing the test program. The main memory 102 has a command memory 104, a plurality of test pattern memories 106, a plurality of expectation pattern memories 108, and a digital capture memory 110.

The command memory 104 stores each command included in the test program. Each of the plurality of test pattern memories 106 is provided corresponding to each terminal of the DUT 100, and stores a test pattern sequence being used during a command cycle period carrying out that command for each terminal in association with each command. Here, the test pattern sequence includes a plurality of test patterns to be sequentially output to the terminals of the DUT 100 during a command cycle period.

Each of the plurality of expectation pattern memories 108 is an example of an expectation pattern storing region according to the present invention, and is provided corresponding to each terminal of the DUT 100. Further, each of the plurality of expectation pattern memories 108 stores an expectation pattern sequence being used during a command cycle period carrying out that command for each terminal in association with each command. Here, the expectation pattern sequence includes an expectation pattern sequence to be sequentially compared with the plurality of output patterns sequentially output from the terminal of the DUT 100 during a command cycle period.

The digital capture memory 110 is an example of an output pattern storing region according to the present invention, and records an output pattern output from the DUT 100, which is obtained by executing the test program. In the present embodiment, the command memory 104, the plurality of test pattern memories 106, the plurality of expectation pattern memories 108, and/or the digital capture memory 110 are respectively provided in different memory areas in the same memory module. However, at least one of these memories may dividedly be provided in separate memory modules composing the main memory 102.

The central pattern control unit 112 is connected to the main memory 102 and the plurality of channel blocks 130, and performs a process common to each terminal of the DUT 100. The central pattern control unit 112 has a pattern list memory 114, a vector-generation controlling unit 116, a central capture control unit 120, and a pattern result memory 122.

The pattern list memory 114 stores start/termination addresses of the routine in the command memory 104, a start address of the test pattern in the test pattern memory 106, a start address of the expectation pattern in the expectation pattern memory 108, or the like in regard to each of a main routine and each subroutine of the test program. The vector-generation controlling unit 116 is an example of a command executing unit according to the present invention, and sequentially executes the plurality of commands included in the test program for the DUT 100 every command cycle. More specifically, the vector-generation controlling unit 116 sequentially reads the commands from the start address to the termination address from the pattern list memory 114 for each routine in order to sequentially execute them. Moreover, the vector-generation controlling unit 116 may re-execute the commands based on the instruction from a tester control apparatus 190.

The central capture control unit 120 receives a decision result for each terminal of the DUT 100 from each of the channel block 130, and totals the decision results of the DUT 100 for each routine. The pattern result memory 122 stores the decision results of the DUT 100 for each routine.

Each of the plurality of channel blocks 130 is provided corresponding to each terminal of the DUT 100. Each channel block 130 has a channel pattern generating unit 140, a timing generating unit 160, a driver 170, and a comparator 180.

The channel pattern generating unit 140 generates a test pattern sequence or an expectation pattern sequence to be used for testing the terminal, and compares the output pattern sequence from the DUT 100 and the expectation pattern sequence. The channel pattern generating unit 140 includes a sequential pattern generating unit 142, a format control unit 144, a sequential pattern generating unit 146, a hunting and comparing unit 148, a fail capture control unit 150, a fail capture memory 152, a memory reading control unit 154, and a capture unit 156.

The sequential pattern generating unit 142 receives a start address of the test pattern sequence to be output corresponding to an execution routine from the vector-generation controlling unit 116. Then, the sequential pattern generating unit 142 sequentially reads the test pattern sequence from the start address from the test pattern memory 106 corresponding to each command cycle in order to sequentially output them to the format control unit 144. The format control unit 144 functions as a test pattern outputting unit according to the present invention along with the driver 170, and converts the test pattern sequence into a format for controlling the driver 170.

The sequential pattern generating unit 146 functions as an example of a memory outputting unit according to the present invention along with the memory reading control unit 154, and receives the start address of the expectation pattern sequence from the vector-generation controlling unit 116 corresponding to the execution routine. Then, the sequential pattern generating unit 146 sequentially reads the expectation patterns from the start address from the expectation pattern memory 108 corresponding to each command cycle, to sequentially output them to the hunting and comparing unit 148 and the fail capture control unit 150.

The hunting and comparing unit 148 is an example of an expectation comparing unit according to the present invention, and inputs the output pattern sequence output from the DUT 100 via the comparator 180 and compares it with the expectation pattern sequence. Moreover, the hunting and comparing unit 148 may input the output pattern sequence read from the digital capture memory 110 by means of the memory reading control unit 154, and compare it with the expectation pattern sequence. Here, the hunting and comparing unit 148 may have a hunting function in which the output pattern sequence having the indefinite timing output from the DUT 100 is compared with the expectation pattern sequence on condition that the specific header pattern sequence is output from the DUT 100.

The fail capture control unit 150 receives match/mismatch information of the output pattern sequence and the expectation pattern sequence of the DUT 100 from the hunting and comparing unit 148, and generates the decision result of that terminal of the DUT 100. The fail capture memory 152 stores fail information including the hunting process result by the hunting and comparing unit 148, the output pattern value not identical with the expected value, and so on.

The capture unit 156 sequentially acquires the output patterns output from the device under test 100 into the digital capture memory 110 according to the instruction from the tester control apparatus 190. The process acquiring the output pattern from the device under test 100 into the digital capture memory 110 is referred to as an acquisition process. The memory reading control unit 154 functions as an example of a memory reading unit according to the present invention along with a sequential pattern generating unit 146. Specifically, the memory reading control unit 154 reads the output pattern stored on the digital capture memory 110 to input it into the hunting and comparing unit 148 according to the instruction of the tester control apparatus 190.

The timing generating unit 160 generates the timing in which the driver 170 outputs each test pattern included in the test pattern sequence and the timing in which the comparator 180 acquires the output patterns from the DUT 100. The driver 170 functions as a test pattern outputting unit according to the present invention along with the format control unit 144, and outputs each test pattern output from the format control unit 144 in the channel pattern generating unit 140 to the DUT 100 in the timing designated by the timing generating unit 160.

The comparator 180 acquires the output pattern output from the terminal of the DUT 100 and supplies it to the hunting and comparing unit 148 in the channel block 130 and the digital capture memory 110, in the timing designated by the timing generating unit 160. The tester control apparatus 190 controls an acquisition process of the output patterns by the capture unit 156, a reading process of the output patterns by the memory reading control unit 154, and a reading process of the expectation patterns by the sequential pattern generating unit 146.

Figure 2:
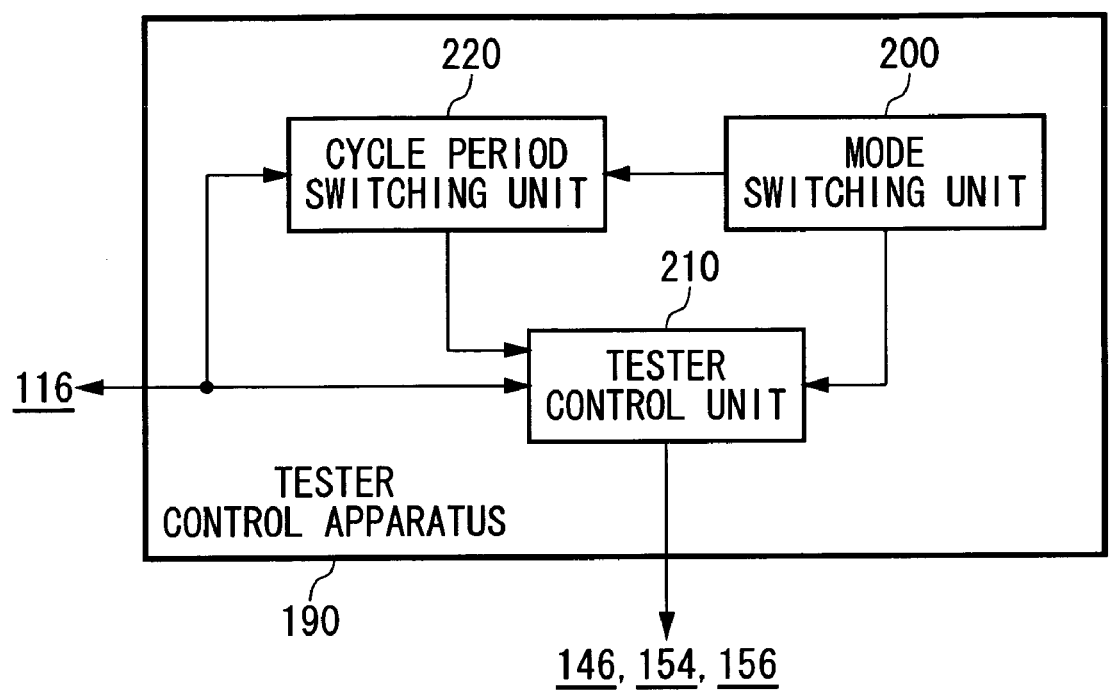
FIG. 2 shows a configuration of a tester control apparatus according to an embodiment of the present invention.

FIG. 2 shows a configuration of the tester control apparatus 190 according to an embodiment of the present invention. The tester control apparatus 190 has a mode switching unit 200, a tester control unit 210, and a cycle period switching unit 220. The mode switching unit 200 selects an output pattern capturing mode or a normal mode. The output pattern capturing mode is an example of a first mode according to the present invention, and is an operation mode sequentially acquiring the output patterns into the main memory 102 during outputting the output patterns by a real-time operation of the device under test. The normal mode is an example of a second mode according to the present invention, and is an operation mode sequentially reading the expectation patterns corresponding to the output patterns from the main memory 102 during outputting the output patterns by a real-time operation of the device under test.

It will be described about a process when it is set to the output pattern capturing mode. At first, in an acquisition process acquiring the output patterns from the device under test 100, the capture unit 156 sequentially stores the output pattern sequence output from the device-under test 100 on the digital capture memory 110 in the main memory 102 according to the instruction from the tester control unit 210. In the acquisition process, since the test apparatus 10 does not compare the expectation patterns and the output patterns, the sequential pattern generating unit 146 does not read the expectation pattern sequence.

The tester control unit 210 performs the following processes when detecting the termination of the acquisition process based on the signal from the vector-generation controlling unit 116. The tester control unit 210 instructs the vector-generation controlling unit 116 to re-execute the test program. The tester control unit 210 instructs the memory reading control unit 154 to read the output pattern sequence consisting of the plurality of output patterns stored on the digital capture memory 110 from the main memory 102. Moreover, the tester control unit 210 instructs the sequential pattern generating unit 146 to read the expectation pattern sequence stored on the expectation pattern memory 108 from the main memory 102. As a result, after the acquisition process has been terminated, the hunting and comparing unit 148 can sequentially compare each of the plurality of expectation patterns and each of the plurality of output patterns every cycle.

More specifically, the memory reading control unit 154 reads each of the plurality of output patterns from the main memory 102 in the cycle period set by the cycle period switching unit 220 according to the instruction of the tester control unit 210. Then, the sequential pattern generating unit 146 reads each of the plurality of expectation patterns from the main memory 102 in the cycle period set by the cycle period switching unit 220. In this way, the hunting and comparing unit 148 can compare the expectation pattern sequence and the output pattern sequence read in the cycle period set by the cycle period switching unit 220.

Next, it will be described about a process when it is set to the normal mode. The tester control unit 210 instructs the capture unit 156 to stop the process storing the output patterns on the digital capture memory 110. In other words, the capture unit 156 does not acquire the output patterns output from the device under test 100 into the main memory 102. Then, the sequential pattern generating unit 146 sequentially reads the expectation pattern sequence from the expectation pattern memory 108. The hunting and comparing unit 148 receives this, and sequentially compares the plurality of expectation patterns included in the read expectation pattern sequence with the plurality of output patterns output from the device under test 100.

When it is set to the output pattern capturing mode, the cycle period switching unit 220 instructs the tester control unit 210 to set the cycle period different from each other during the acquisition process and after the acquisition process. Specifically, the cycle period switching unit 220 compares a cycle period of a cycle, in which the hunting and comparing unit 148 repeatedly compares each expectation pattern and each corresponding output pattern, and a cycle, in which the driver 170 outputs each output pattern from the device under test 100, in order to largely set the cycle period of the cycle.

Figure 3:
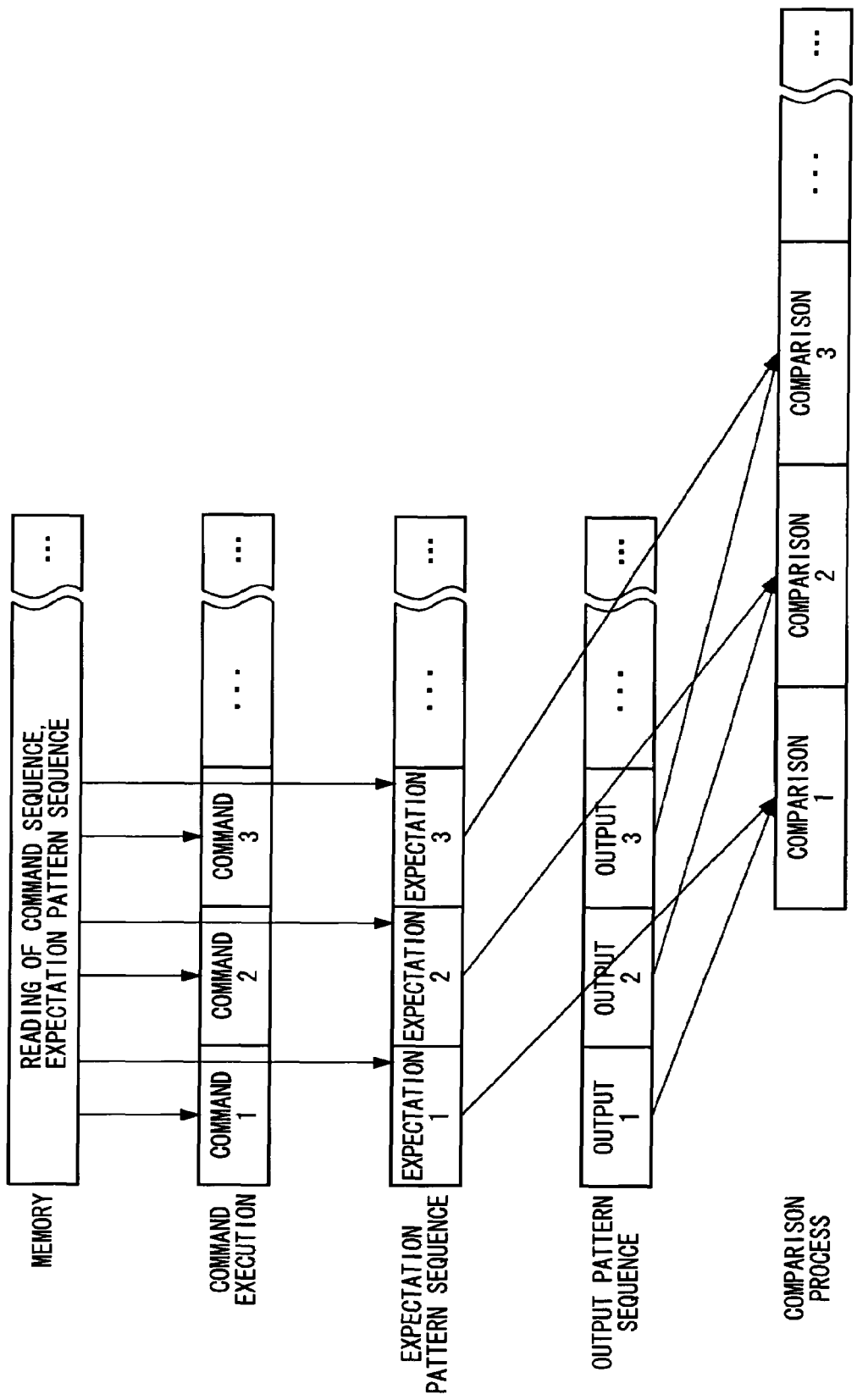
FIG. 3 shows the timing in which an output pattern output from any output terminal of a DUT is compared with an expectation pattern in a normal mode.

FIG. 3 shows the timing in which the output patterns output from any output terminal of the DUT 100 is compared with the expectation patterns in the normal mode. The vector-generation controlling unit 116 reads the plurality of commands included in the test program from the command memory 104, to sequentially execute them every command cycle. The sequential pattern generating unit 146 reads each of the plurality of expectation patterns included in the expectation pattern sequence according to the execution of the command corresponding to the expectation pattern. The hunting and comparing unit 148 inputs the output patterns corresponding to the test patterns, and compares the input output patterns and the expectation patterns.

In addition, in the normal mode, the test apparatus 10 stores the only comparison result with the expectation patterns on the fail capture memory 152 without storing the output patterns on the main memory 102. For this reason, even if a failure of the device under test 100 is detected, it is not possible to analyze the output patterns to investigate the cause of the failure. Meanwhile, when wanting to store the output patterns, the test apparatus 10 should be set to the output pattern capturing mode by a user.

Figure 4:
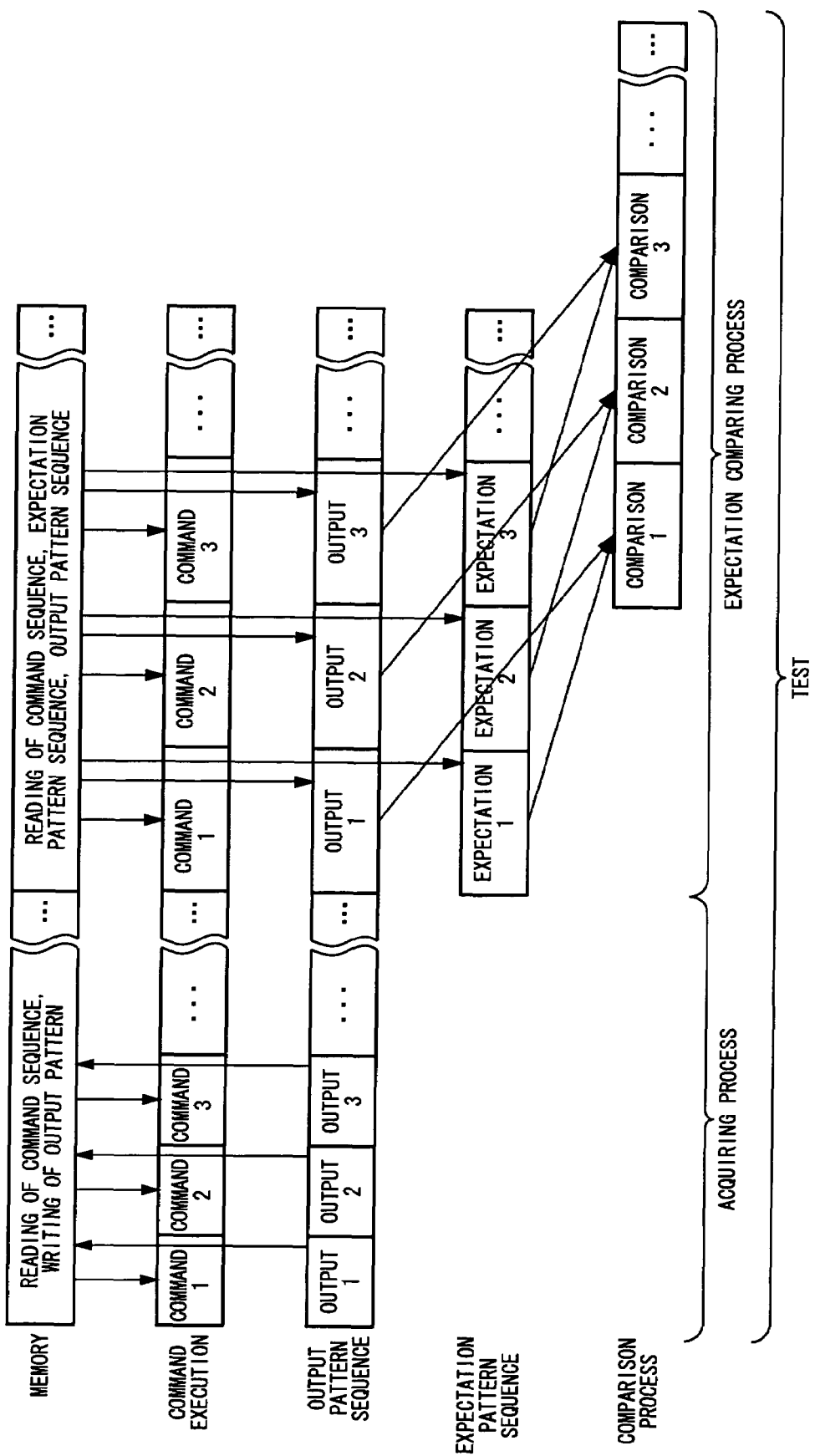
FIG. 4 shows the process in which an output pattern output from any output terminal of the DUT is acquired into a main memory in an output pattern capturing mode.

FIG. 4 shows the process in which the output patterns output from any output terminal of the DUT 100 is acquired into the main memory 102 in the output pattern capturing mode. Like FIG. 3, the vector-generation controlling unit 116 reads the plurality of commands included in the test program from the command memory 104, to sequentially execute them every command cycle. However, unlike FIG. 3, the capture unit 156 sequentially stores the output patterns output from the device under test 100 on the main memory 102. In this case, the sequential pattern generating unit 146 does not read the expectation pattern sequence. Moreover, the hunting and comparing unit 148 does not compare the output pattern sequence and the expectation pattern sequence.

When the acquisition process is terminated, the vector-generation controlling unit 116 sequentially re-executes the plurality of commands included in the test program. This process re-executing the commands is referred to as an expectation comparing process. Then, the memory reading control unit 154 reads the output pattern corresponding to each of the plurality of re-executed commands from the main memory 102. Moreover, the sequential pattern generating unit 146 reads the expectation pattern corresponding to each of the plurality of re-executed commands from the main memory 102. The hunting and comparing unit 148 receives this, and sequentially compares the expectation patterns and the output patterns corresponding to the plurality of re-executed commands every command cycle in order to compare the expectation pattern sequence and the output pattern sequence.

Here, as shown in FIG. 4, the acquisition process performs a reading of a command and a writing of an output pattern while the expectation comparing process performs a reading of a command, a reading of an expectation pattern, and a reading of an output pattern. Moreover, since the good or bad of all output patterns must be decided based on the expectation pattern sequence, the number of cycles by which the output pattern sequence is output in the acquisition process is identical with the number of cycles by which the expectation pattern sequence and the output pattern sequence are compared. Therefore, when the acquisition process and the expectation comparing process operate in the same cycle frequency, the expectation comparing process requires a memory bandwidth wider than that of the acquisition process.

Meanwhile, according to the test apparatus 10 of the present embodiment, the cycle period switching unit 220 compares a cycle period of the commands executed in the expectation comparing process with a cycle period of the commands executed in the acquisition process, to set the cycle period greatly. As a result, since the bandwidth of the main memory 102 required in the acquisition process and the expectation comparing process can have the same magnitude, it is possible to efficiently utilize the bandwidth of the main memory in both of the acquisition process and the expectation comparing process.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to store an output pattern from a device under test on a main memory without increasing a request bandwidth of the main memory of a test apparatus.

What is claimed is:

1. A test apparatus that tests a device under test, comprising:

a main memory having an expectation pattern storing region storing an expectation pattern sequence to be sequentially compared with a plurality of output patterns sequentially output from a terminal of the device under test;

a test pattern outputting unit for sequentially inputting a plurality of test patterns into the device under test;

a capture unit for sequentially acquiring the output patterns into an output pattern storing region on said main memory in a first period of a cycle in an acquisition process;

a memory reading unit for reading an output pattern sequence consisting of the plurality of acquired output patterns and the expectation pattern sequence from said main memory in a second cycle period of a cycle, when the acquisition process acquiring the output patterns into the output pattern storing region has been terminated;

an expectation comparing unit for comparing the read expectation pattern sequence and the output pattern sequence in said second cycle period of a cycle; and a cycle period switching unit for setting said first period and second period in a way that said second period is larger than said first period.

2. A method of testing a device under test by means of a test apparatus, the test apparatus comprising a main memory that has an expectation pattern storing region storing an expectation pattern sequence to be sequentially compared with a plurality of output patterns sequentially output from a terminal of the device under test, and the testing method comprising:

a test pattern outputting step of sequentially inputting a plurality of test patterns into the device under test;

a capture step of sequentially acquiring the output patterns into an output pattern storing region on said main memory in a first cycle period of a cycle in an acquisition process;

a memory reading step of reading an output pattern sequence consisting of the plurality of acquired output patterns and the expectation pattern sequence from said main memory in a second cycle period of a cycle, when the acquisition process acquiring the output patterns into the output pattern storing region has been terminated; and an expectation comparing step of comparing the read expectation pattern sequence and the output pattern sequence in said second cycle period of a cycle; and a cycle period switching step for setting said first cycle period and said second cycle period in a way that said second cycle period is larger than said first cycle period a result outputting step for outputting a good or bad result based on the expectation comparison step.

3. The method as claimed in claim 2, wherein said expectation comparing step sequentially compares each of a plurality of expectation patterns included in the expectation pattern sequence and each of the plurality of output patterns included in the output pattern sequence every cycle, the test apparatus further comprises a cycle period switching unit for comparing a cycle period of a cycle, in which said expectation comparing unit repeatedly compares each expectation pattern and each corresponding output pattern, and another cycle period of a cycle, in which said test pattern outputting unit outputs each output pattern from the device under test, in order to largely set the cycle period of the cycle, said memory reading step reads the output pattern sequence consisting of the plurality of output patterns stored on said main memory and the expectation pattern sequence from said main memory in the cycle period set by said cycle period switching step, and said expectation comparing step compares the expectation pattern sequence and the output pattern sequence by the number of cycles identical with the number of cycles by which the output pattern sequence is output from the device under test.

4. The method as claimed in claim 2, wherein the test apparatus further comprises a mode switching unit for selecting a first mode sequentially acquiring the output patterns into said main memory during outputting the output patterns from the device under test or a second mode sequentially reading the expectation patterns corresponding to the output patterns from said main memory during outputting the output patterns from the device under test, when the first mode has been selected, said capture step sequentially acquires the output patterns output from the device under test into said main memory, said memory reading step reads the output pattern sequence consisting of the plurality of output patterns stored on said main memory and the expectation pattern sequence from said main memory when the acquisition process has been terminated, and said expectation comparing step compares the read expectation pattern sequence and the output pattern sequence, and when the second mode has been selected, said capture step does not store the output patterns output from the device under test on said main memory, said memory reading step sequentially reads the expectation pattern sequence from the expectation pattern storing region, and said expectation comparing step sequentially compares the plurality of expectation patterns included in the expectation pattern sequence read by said memory reading step with the plurality of output patterns.

5. The method as claimed in claim 2, wherein the test apparatus further comprises:

a command memory for storing a test program for the device under test; and a command executing unit for sequentially executing a plurality of commands included in the test program every command cycle, said command executing unit sequentially re-executes the plurality of commands included in the test program when the acquisition process has been terminated, said memory reading step reads the expectation patterns and the output patterns corresponding to each of the plurality of re-executed commands from said main memory, and said expectation comparing step compares the expectation pattern sequence and the output pattern sequence by comparing the expectation patterns and the output patterns corresponding to each of the plurality of re-executed commands.

* * * * *